(12) United States Patent
Townsend, III et al.

(10) Patent No.: US 6,815,333 B2
(45) Date of Patent: Nov. 9, 2004

(54) TRI-LAYER MASKING ARCHITECTURE FOR PATTERNING DUAL DAMASCENE INTERCONNECTS

(75) Inventors: Paul H. Townsend, III, Midland, MI (US); Lynne K. Mills, Midland, MI (US); Joost J. M. Waeterloos, Heverlee Vlaams Brabant (BE); Richard J. Strittmatter, Midland, MI (US)

(73) Assignee: Dow Global Technologies Inc., Midland, MI (US)

( * ) Notice: Subject to any disclaimer, the term of this patent is extended or adjusted under 35 U.S.C. 154(b) by 0 days.

(21) Appl. No.: 10/402,073

(22) Filed: Mar. 28, 2003

(65) Prior Publication Data

US 2003/0219973 A1 Nov. 27, 2003

Related U.S. Application Data

(60) Provisional application No. 60/369,489, filed on Apr. 2, 2002, and provisional application No. 60/369,490, filed on Apr. 2, 2002.

(51) Int. Cl.$^7$ .......................................... H01L 21/4763
(52) U.S. Cl. ....................... 438/623; 438/624; 438/625; 438/633; 438/634; 438/637; 438/687
(58) Field of Search ................................ 438/623–625, 438/633, 637, 638, 687, 634

(56) References Cited

U.S. PATENT DOCUMENTS

| | | | |
|---|---|---|---|
| 5,275,695 A | * | 1/1994 | Chang et al. ................. 216/27 |
| 5,679,608 A | | 10/1997 | Cheung et al. .............. 437/195 |
| 6,071,809 A | | 6/2000 | Zhao ............................ 438/634 |
| 6,140,023 A | | 10/2000 | Levinson et al. ............ 430/313 |
| 6,140,226 A | * | 10/2000 | Grill et al. ................... 438/637 |
| 6,218,078 B1 | * | 4/2001 | Iacoponi ...................... 430/313 |
| 6,218,317 B1 | | 4/2001 | Allada et al. ................ 438/780 |
| 6,265,319 B1 | | 7/2001 | Jang ............................ 438/723 |
| 6,309,962 B1 | | 10/2001 | Chen et al. .................. 438/638 |
| 6,383,907 B1 | | 5/2002 | Hasegawa et al. ........... 438/597 |
| 6,383,912 B1 | | 5/2002 | Chung et al. ................ 438/624 |
| 2001/0012689 A1 | | 8/2001 | Okoroanyanwu et al. ... 438/637 |
| 2001/0023990 A1 | | 9/2001 | Yokoyama et al. .......... 257/773 |
| 2002/0074659 A1 | | 6/2002 | Dalton et al. ................ 257/758 |
| 2003/0119305 A1 | * | 6/2003 | Huang et al. ................ 438/633 |

FOREIGN PATENT DOCUMENTS

| | | | | |
|---|---|---|---|---|
| WO | WO 00/75979 A1 | 12/2000 | ......... | H01L/21/316 |
| WO | WO 01/18861 A1 | 3/2001 | ......... | H01L/21/768 |
| WO | WO 02/16477 A2 | 2/2002 | ............ | C08G/77/00 |
| WO | WO 02/083327 | 10/2002 | ............ | B05D/7/00 |

OTHER PUBLICATIONS

Goldblatt, et al., "A High Performance 0.3 μm Copper BEOL Technology with Low–k Dielectric," *Proc. IITC*, Jun. 2000, pp. 261–263.

So, et al. "Method of Making a Nanoporos Film," U.S. application Ser. No. 10/077,646, filed: Feb. 15, 2002.

* cited by examiner

*Primary Examiner*—Hsien Ming Lee
(74) *Attorney, Agent, or Firm*—Susan Moeller Zerull

(57) ABSTRACT

This invention relates to a method of dual damascene integration for manufacture of integrating circuits using three top hard mask layers having alternating etch selectivity characteristics.

37 Claims, 11 Drawing Sheets

TRI-LAYER MASKING ARCHITECTURE FOR PATTERNING DUAL DAMASCENE INTERCONNECTS

CROSS-REFERENCE TO RELATED APPLICATION

This application claims the benefit of provisional applications No. 60/369,489, and No. 60/369,490 both filed on Apr. 2, 2002, which is incorporated by reference in its entirety.

FIELD OF THE INVENTION

The present invention relates to methods and structures for the fabrication of multilevel interconnects in integrated circuits, and more particularly to hardmask structure and processes for dual damascene integration.

BACKGROUND OF THE INVENTION

An integrated circuit device contains transistors connected by multiple levels of metal interconnects. These metal interconnects (lines or plugs) are separated from each other by interlayer dielectrics (ILD)—i.e. the electrically insulating material between metal interconnects. The metal interconnects are found in lines or trenches that within a layer are separated from each other by the ILD. This layer is sometimes referred to as the trench layer. In addition, metal lines in adjacent trench layers are separated by via layers that contain holes or vias filled with conducting metal also in ILD material. This layer is sometimes referred to as the via layer.

Conventionally, integrated circuit articles have been made using $SiO_x$ as the interlayer dielectric (ILD). However, as integrated circuit device features have become smaller the dielectric properties of $SiO_x$ were recognized to be insufficient to prevent cross-talk and other interference causing decreased circuit performance. Thus, alternative materials "low-k" materials having lower dielectric constants (less than 3.0) are being developed. These low dielectric constant materials fall within two compositional categories: those that contain significant amounts of silicon forming the backbone of the molecular structure (referred to herein as inorganic dielectrics) and those composed primarily of carbon forming the backbone of the molecular structure (referred to herein as organic dielectrics). While inorganic dielectrics are formed primarily with silicon and, optionally oxygen, in the backbone, these inorganic dielectrics may contain organic portions. Similarly, while the organic dielectrics contain primarily carbon, and optionally oxygen, in the backbone, they may also have a small amount of silicon or other like molecules in the composition. According to the above definition, examples of inorganic low dielectric constant materials are silsesquioxanes, and the like. According to the above definition, examples of organic low dielectric constant materials, are polyarylenes, including polyarylene ethers (e.g. SiLK™ dielectric resins from The Dow Chemical Company, Flare™ resins from Honeywell) and benzocyclobutene based resins (e.g. Cyclotene™ resins from The Dow Chemical Company which include some Si atoms in their structure). Moreover, as the feature sizes are being pushed even smaller in integrated circuits, porous dielectric layers are being used to further reduce the dielectric constant and improve electrical insulative properties.

In addition to material selection, method of manufacture (referred to as integration) of the integrated circuit article is also of vital importance. In one common method of manufacture known as dual damascene, the via and trench layer dielectric material or materials are applied, vias and trenches are formed in these layers by removing the dielectric material to form the desired via and trench pattern, and the via and trench are filled with the conducting metal. The formation of the vias and trenches can be quite complex using a variety of lithographic techniques that include photoresists, mask layers, various etch processes, etc.

One common dual damascene approach uses an etch stop layer between the via layer dielectric which is applied first to the substrate and the trench layer dielectric to form a trilayer dielectric stack. See e.g. U.S. Pat. No. 6,071,809 where an inorganic dielectric layer is used between two low-k organic dielectric layers. In WO01/18861, Chung et al., recognized that by selecting the middle dielectric layer to be of a different class (i.e. organic or inorganic class) from the via and trench level dielectric material, all the materials in the stack may be low-k dielectrics, thus, lowering the overall effective dielectric constant of the trilayer stack. Chung particularly focuses on a trilayer dielectric stack that has two inorganic layers separated by an organic layer and teaches use of organic photoresists over the top inorganic layer to form the patterns in the dielectric stack.

A complication that arises when organic dielectrics are used is that the etch rates for photoresist and organic dielectrics are very similar. This makes forming the vias and trenches in such organic dielectrics more complex. In addition, the ability of the top portion of the dielectric stack to withstand chemical mechanical polishing (CMP) may become difficult if that portion is an organic dielectric. Thus, in the case where the contact and trench dielectric materials are organic, two inorganic hardmasks are conventionally deposited by chemical vapor deposition (CVD) on top of the tri-layer dielectric to facilitate the patterning process. For example, Zhao, in U.S. Pat. No. 6,071,809, discloses a method for forming dual damascene structures in a tri-layer dielectric by the use of a dual hardmask composed of CVD silicon oxide and CVD silicon nitride. When the contact and trench dielectrics are applied by spin coating as is most common for organic dielectrics, the addition of CVD processes in the masking construction is complex, expensive, and limits throughput.

"A High Performance 0.13 mm Copper BEOL Technology with Low-k Dielectric," R. D. Goldblatt et. al., Proc. IITC, June 2000, page 261–263, describes a dual damascene approach for patterning in a monolithic dielectric material in which both the via and trench will be formed. This method requires rigorous control of the plasma etch conditions so as to maintain a planar surface as the etch-front advances into the layer being etched. Presuming, the ability to maintain this etch morphology, the monolithic dielectric is capable of both reducing the process complexity by the elimination of the etch stop while reducing the overall capacitance in the dielectric construction.

Spin on etch stops and hardmasks have been taught (see e.g. U.S. Pat. No. 6,265,319 and U.S. Pat. No. 6,218,078) in simple single layer masking systems.

SUMMARY OF THE INVENTION

Applicants have invented a simple, convenient mask system and dual damascene patterning method for monolithic or tri-layer dielectric stacks that would provide the necessary etch selectivity while taking into account the desire to use a single deposition method (e.g. spin coating) for applying the dielectric material and the masking material and the use of dielectric materials that may be susceptible to damage during CMP steps (e.g. organic dielectrics and porous dielectrics). This system has the additional benefit that, if desired, it can be used to minimize the number of distinct raw materials that are used in making the metal interconnect structure in the microelectronic device.

Thus, according to a first embodiment, the invention is an article comprising a) a substrate, b) on the substrate, a dielectric stack comprising a top portion having a dielectric constant of less than 3.0, c) a first mask layer over the dielectric stack which first mask layer is resistant to erosion by chemical mechanical polishing system which is designed to remove copper and which first layer has etch selectivity relative to the top portion of the dielectric stack, d) a second mask layer over the first mask layer, which second mask layer has etch selectivity relative to the first mask layer and has etch characteristics similar to those of the top portion of the dielectric stack, and e) a third mask layer over the second mask layer, which third mask layer has etch selectivity relative to the second mask layer and has etch characteristics similar to those of the first mask layer.

According to a second embodiment, this invention is a method of forming trenches and vias in a dielectric stack comprising the steps of (a) providing a substrate;

(b) applying the dielectric stack to the substrate wherein the dielectric stack comprises a top portion in which trenches will be formed and a bottom portion in which vias will be formed and an etch stop layer between the top and bottom portions wherein the dielectric constant of each of the top portion and the bottom portion is less than 3.0, preferably less than 2.7;

(c) applying a first mask layer which acts as a stop during the polishing step and which has etch selectivity relative to the top portion of the dielectric stack and has etch characteristics similar to those of the etch stop layer;

(d) applying a second mask layer which has etch selectivity relative to the first mask layer and has etch characteristics similar to those of the top portion of the dielectric stack;

(e) applying a third mask layer which has etch selectivity relative to the second mask layer and having etch characteristics similar to those for the first layer, (f) patterning the first, second and third mask layers in accordance with a trench pattern (g) patterning the etch stop layer with a via pattern (h) etching the trench pattern into the top portion of the dielectric stack to form at least one trench and the via pattern into the bottom portion of the dielectric stack to form at least one via, (i) depositing a metal in the vias and trenches, (j) polishing away excess metal wherein the first mask layer serves as a polishing stop, wherein at least a substantial portion of the third mask layer is removed during patterning of either the first mask layer or the etch stop layer and wherein at least a substantial portion of the second mask layer is removed during etching of the dielectric stack.

According to a third embodiment a method of forming trenches and vias in a dielectric comprising the steps of (a) providing a substrate;

(b) applying the dielectric layer to the substrate wherein the dielectric layer comprises a top portion in which trenches will be formed and a bottom portion in which vias will be formed and wherein the dielectric constant of the layer is less than 3.0, preferably less than 2.7;

(c) applying a first mask layer which acts as a stop during the polishing step and which has etch selectivity relative to the dielectric layer;

(d) applying a second mask layer which has etch selectivity relative to the first mask layer;

(e) applying a third mask layer which has etch selectivity relative to the second mask layer and which has etch characteristics similar to those of the first mask layer, (f) patterning the second and third mask layers in accordance with a trench pattern (g) patterning the first mask layer in accordance with a via pattern, (h) etching the via pattern a portion of the way into the dielectric layer, (i) patterning the first mask layer in accordance with the trench pattern made in the second and third mask layers and simultaneously removing a substantial portion of the third mask layer, (j) continue the etch of the dielectric layer thereby forming at least one via in the bottom portion of the dielectric layer and forming at least one trench in the top portion of the dielectric layer, (k) wherein the third mask layer is substantially removed during patterning of either the first mask layer or the etch stop layer and wherein the second mask layer is substantially removed during etching of the dielectric stack (l) depositing a metal in the vias and trenches, (m) polishing away excess metal wherein the first mask layer serves as a polishing stop.

"Etch characteristics similar to" as used herein means that the two materials are etched by the same chemistry with etch selectivity that is in the same range relative to the other materials in the stack. Preferably, these materials will have an etch selectivity ratio relative to one another of less than 5:1, preferably less than 3:1, more preferably less than 2:1.

"Etch selectivity" as used herein means that the first and second materials will etch at sufficiently different rates when subjected to an etch chemistry such that each can be patterned separately. Preferably, when layers are stated herein to have etch selectivity relative to another material the layers have etch selectivity ratios of greater than 5:1, more preferably greater than about 7:1 and most preferably greater than about 10:1.

"Etch selectivity ratio" as used herein means that for an etch chemistry, the rate at which one material is etched divided by the rate at which a second material is etched.

DETAILED DESCRIPTION OF THE INVENTION

As used herein a via means a hole in which a metal interconnect plug is formed. The depth of the via is limited by the thickness of the dielectric layer in which the via is formed. The length and width of the via are of the same order of magnitude.

As used herein a trench means a channel in which a metal interconnect line is formed. The depth of the trench is limited by the thickness of the dielectric layer in which the trench is formed. The length of the trench is large relative to the width of the trench.

The substrates 105 useful in this invention include any known substrate on which one may desire to form a metal interconnect structure. Particularly preferred substrates are substrates that comprise transistors to which one desires to connect a metal interconnect structure.

The article and method of this invention may be used to construct any level in the metal interconnect structure. Thus, since several interconnect layers are frequently desired, the substrate will generally comprise existing metal conductive lines 106 and contacts 107 to which the subsequent vias and trenches formed in the method of this invention will be connected. In such instances, the substrate may comprise an optional cap or copper diffusion barrier 110, frequently silicon nitride or silicon carbide, over the surface and particularly the metal lines 106 existing in the substrate. If such a cap or diffusion layer 110 is used, the method of this invention will also include etching through that layer prior to depositing the metal in the next layer of connecting vias and trenches.

Figure 1:
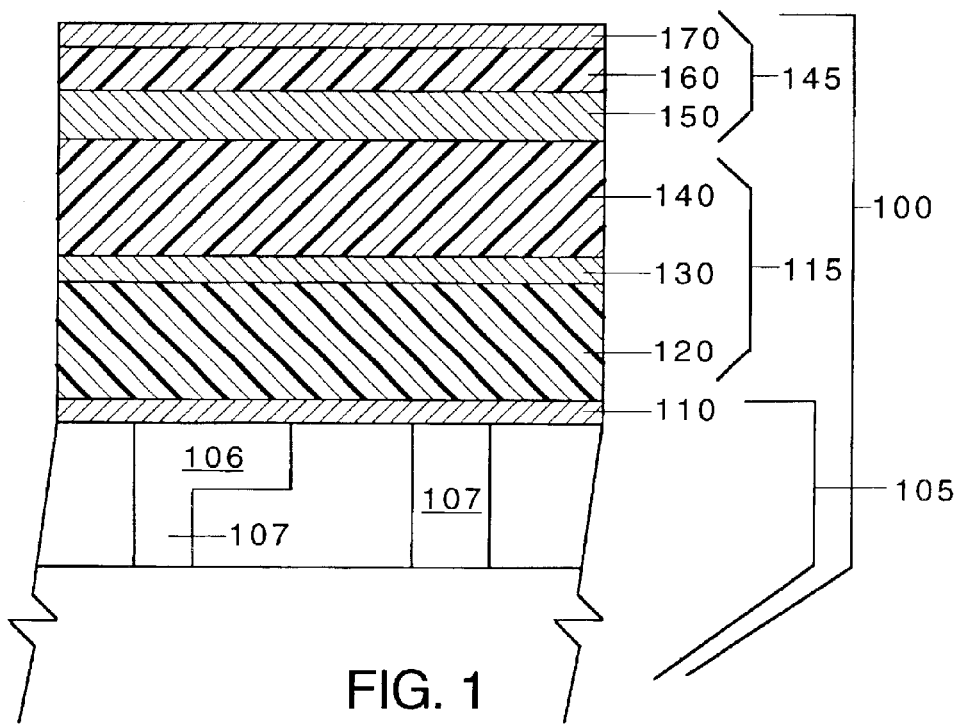
FIG. 1 is a schematic (not to scale) of one exemplary embodiment of this invention having a buried etch stop layer.

Referring particularly to FIG. 1, according to one embodiment, this invention is an article 100 having a substrate 105. In this embodiment, the dielectric stack 115 comprises 3 portions: a bottom portion 120 referred to as the contact dielectric or via dielectric, a middle portion 130 referred to as the etch stop or buried hardmask, and a top portion 140 referred to as the trench dielectric.

The materials used for the contact dielectric layer 120 and trench dielectric layer 140 are low dielectric constant materials having dielectric constants of less than 3.0, preferably less than 2.7, more preferably less than about 2.3. These dielectric layers may optionally be porous. The contact dielectric layer 120 and trench dielectric layer 140 may be the same or different but must be of the same class—i.e. either both being organic dielectric materials or both being inorganic dielectric materials. Preferably, both layers are organic dielectric materials. More preferably, the layers are porous organic dielectric materials. The etch stop 130 is selected such that it is of the opposite class from the dielectric layers 120 and 140. Thus, since the dielectric layers are preferably organic, the etch stop layer is preferably an inorganic material. Preferably, the etch stop also has a relatively low dielectric constant of less than about 3.7, more preferably less than 3.0.

The mask system 145 of this invention contains three layers: the first mask layer or polish stop 150, the second mask layer or etch buffer 160, and the third mask layer or top mask layer 170. The polish stop 150 preferably is selected such that it is resistant to or can at least protect the dielectric stack from the chemical mechanical polishing process that is typically performed after metal deposition. While some inorganic dielectric layers may themselves be resistant to the chemical mechanical polishing process, others, such as porous inorganic dielectrics may be damaged in these processes. The polish stop 150 is also selected such that it is of the opposite class as the trench dielectric 140 and in the same class as the etch stop 130. Thus, since the trench dielectric is preferably organic, the polish stop is preferably inorganic. Finally, since it is possible, but not required, that the polish stop remain as part of the article and not be removed from the article before application of the next interconnect layer, it may be desirable that the polish stop, like the etch stop 130 have a relatively low dielectric constant. The polish stop may be the same material as the etch stop or may be different.

The etch buffer 160 is of the same class as the trench dielectric 140 and of opposite class to the polish stop 150. Thus since the trench dielectric preferably is an organic material the etch buffer is also preferably an organic material. Since the etch buffer layer is removed during processing and this layer is not part of the final article the dielectric constant of this layer is unimportant. However, if reduction of the number of materials used in the fabrication process is important to a user, the same material used as a dielectric may also be used as an etch buffer. Finally, the top mask 170 is of the same class as the polish stop 150 and the etch stop 130. Like the etch buffer the top mask is removed during processing and thus the dielectric constant of this layer is unimportant. However, if reduction of the number of materials used in the fabrication process is important to a user, the same material used as a polish stop or etch stop may also be used as a top mask.

Figure 2:
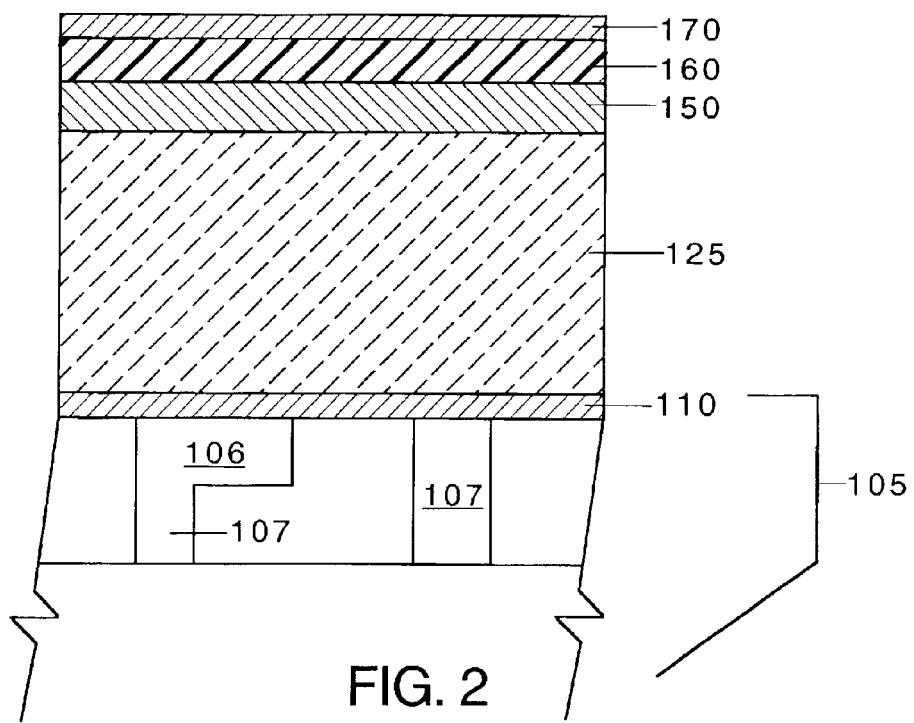
FIG. 2 is a schematic (not to scale) of one exemplary embodiment of this invention having a monolithic dielectric layer.
Figure 3A:
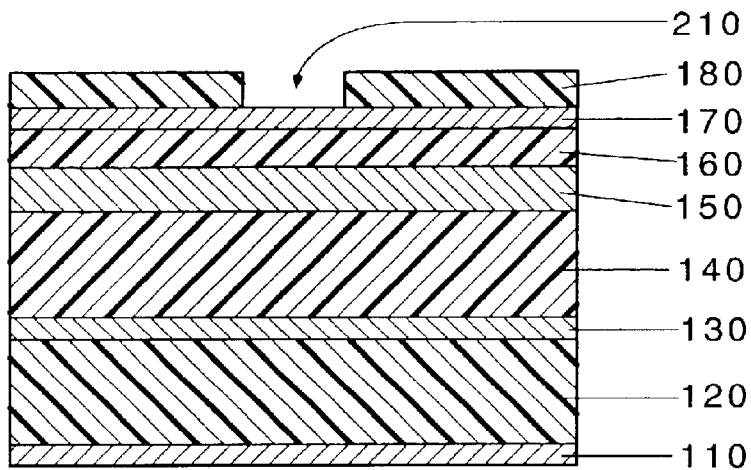
FIG. 3 is a schematic (not to scale) of an exemplary integration scheme using the article of FIG. 1.
Figure 3B:
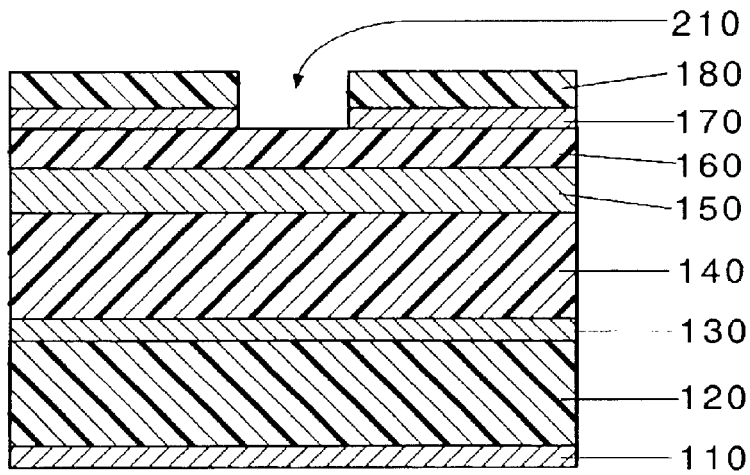
Figure 3C:
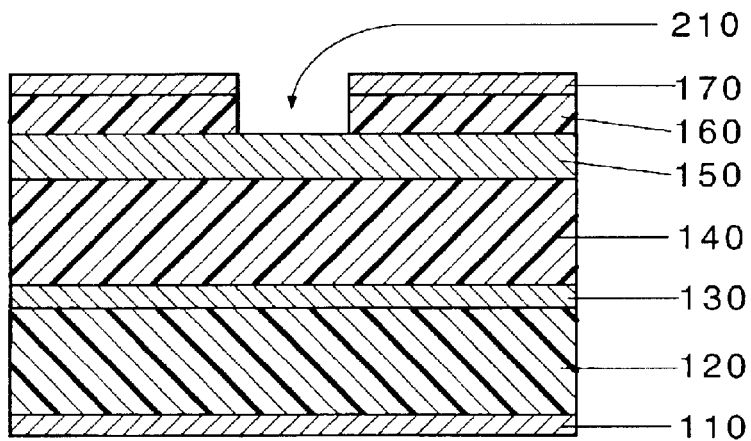
Figure 3D:
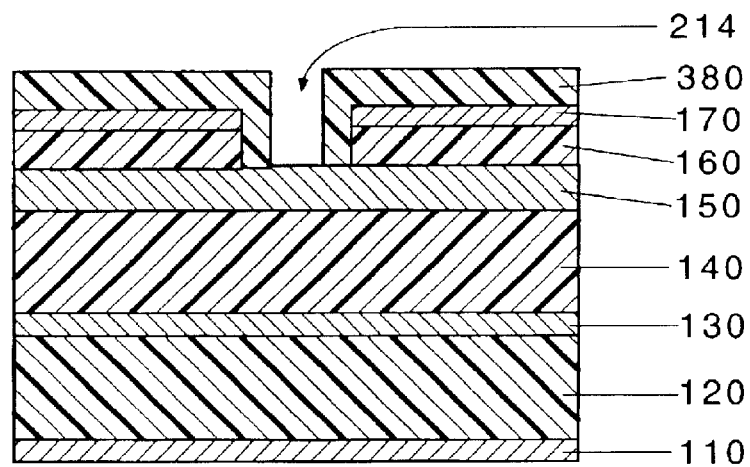
Figure 3E:
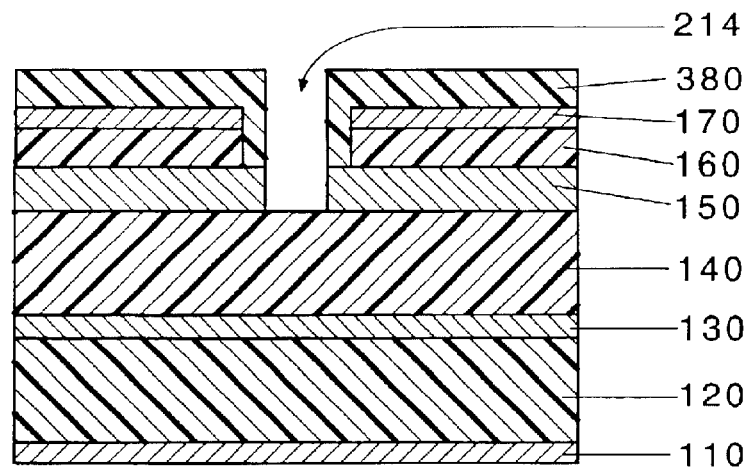
Figure 3F:
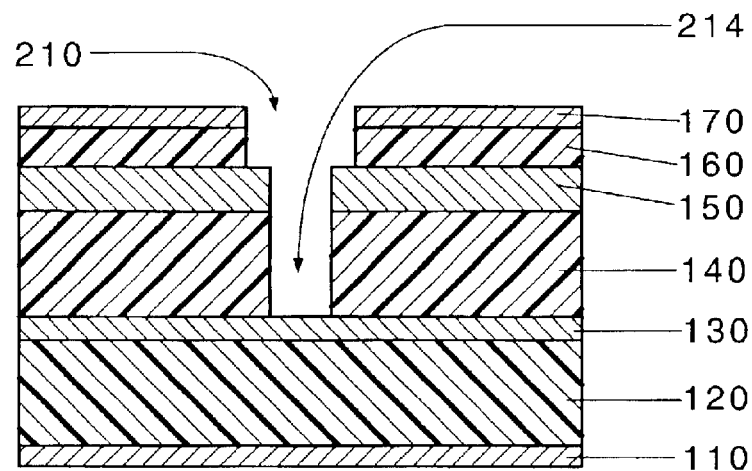
Figure 3G:
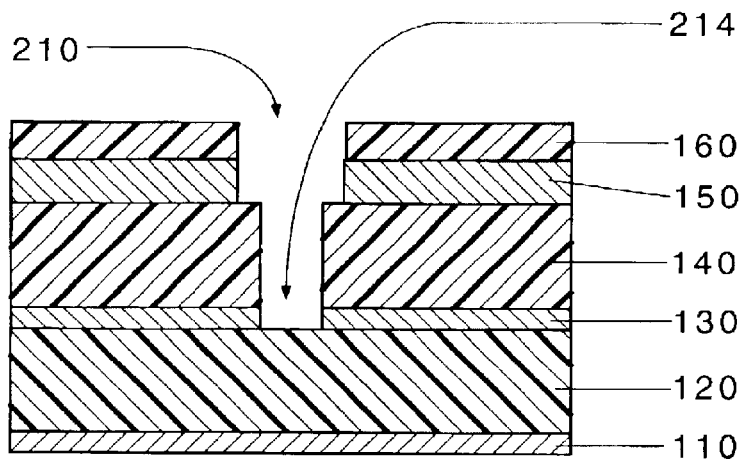
Figure 3H:
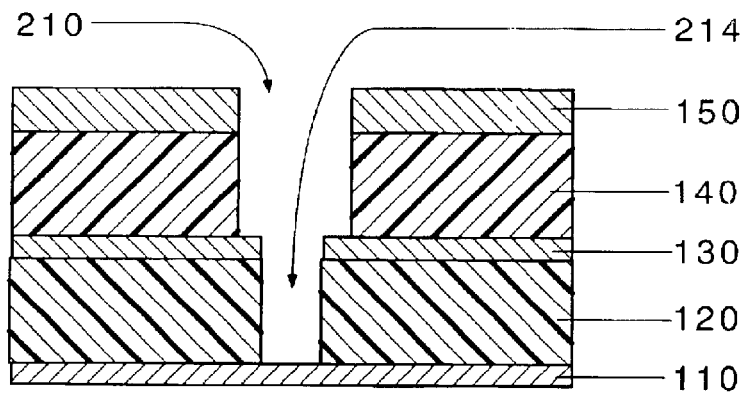
Figure 4A:
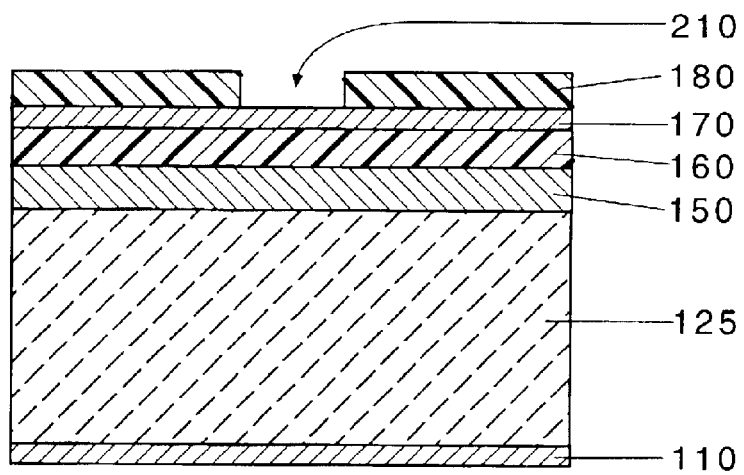
FIG. 4 is a schematic (not to scale) of an exemplary integration scheme using the article of FIG. 1.
Figure 4B:
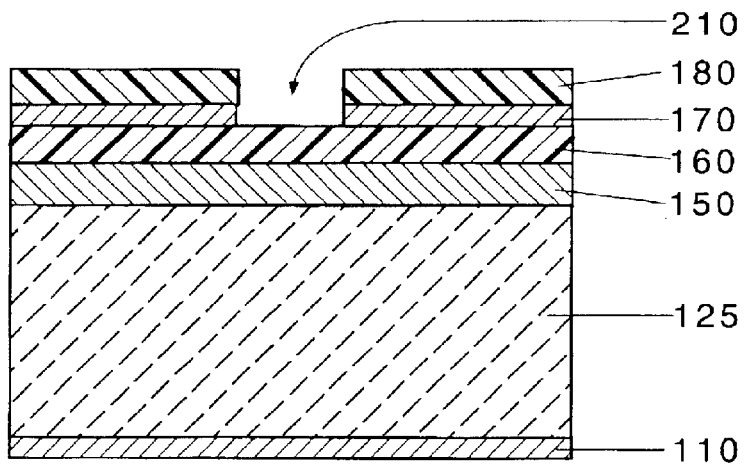
Figure 4C:
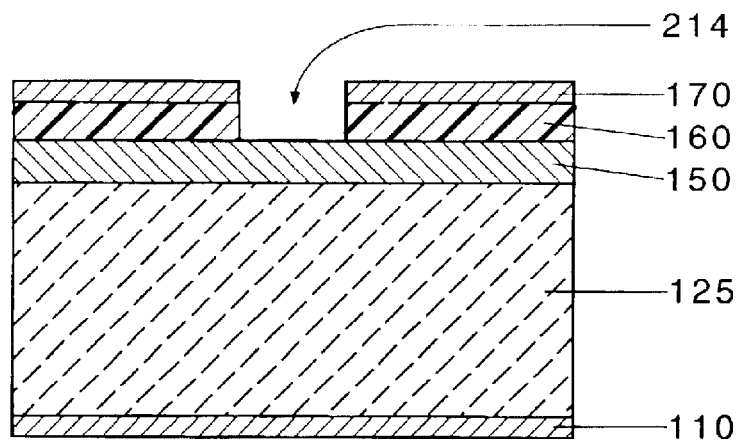
Figure 4D:
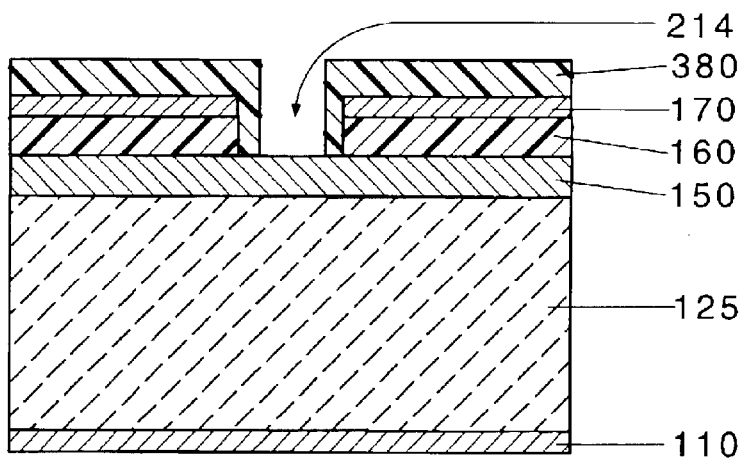
Figure 4E:
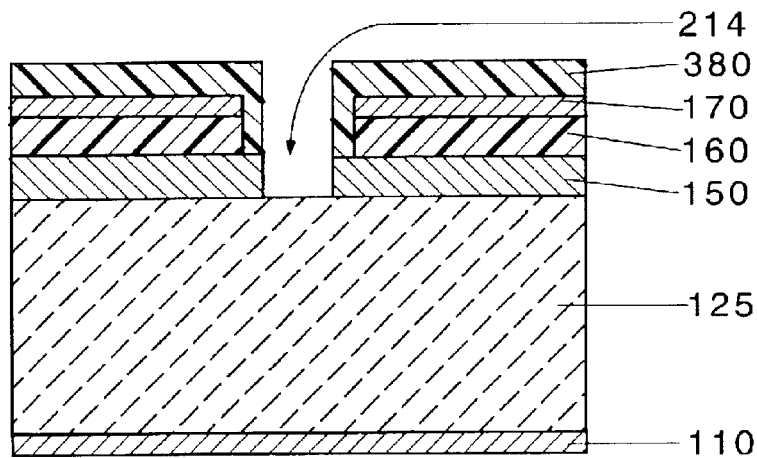
Figure 4F:
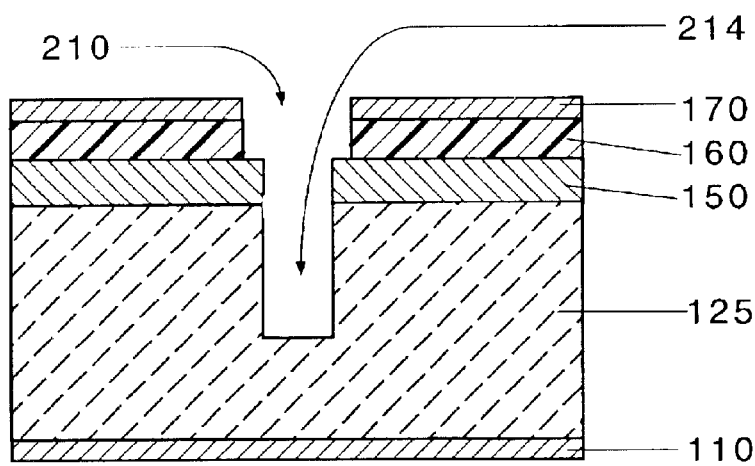
Figure 4G:
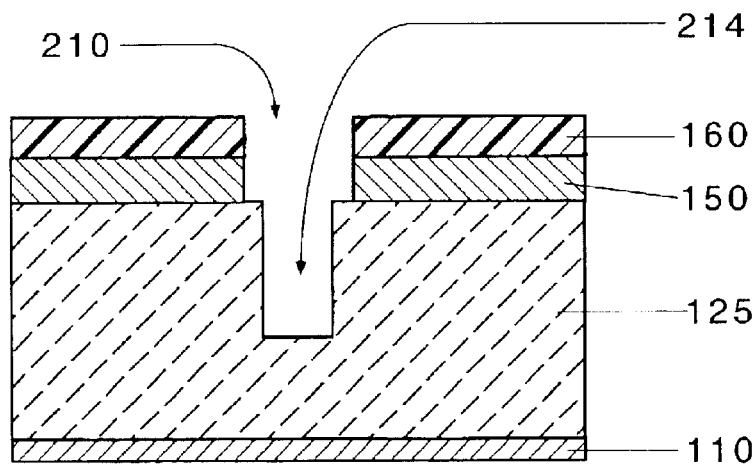
Figure 4H:
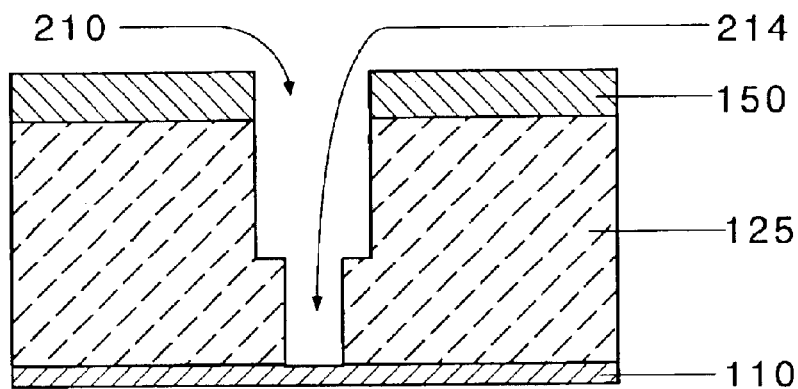

According to an alternative embodiment, the article of this invention is as shown in FIG. 2. In this embodiment, rather than having a dielectric stack with two dielectric layers separated by an etch stop, the dielectric is a monolithic layer 125. This dielectric material has a dielectric constant of less than 3.0, preferably less than 2.7, more preferably less than 2.3. This layer may be organic or inorganic, porous or non-porous. Preferably, however, the layer is organic. More preferably, the layer is porous. The other components of the article remain the same as discussed above with regard to FIG. 1. Note that in this instance the polish stop 150 and the top mask 170 should be of the opposite class of materials from the dielectric 125 and the etch buffer 160.

One key advantage to the present invention is that all the dielectric and mask layers may be applied by the same method. Preferably, all of these layers are applied by solvent coating followed by drying and preferably cure past the gel point such that the layers are not damaged by application of subsequent solvent coated layers. Most preferably, the solvent coating occurs by spin coating according to known methods.

By using alternating layers from the two different classes of materials used herein—inorganic materials which contain significant amounts of silicon forming the backbone of the molecular structure, and organic materials which comprise primarily carbon in the backbone of the molecular structure—one can easily pattern the dielectric stack by alternating between chemistries which etch organic materials and chemistries which etch inorganic materials. Non-limiting examples of such patterning approaches are as follows:

Referring now to FIG. 3, one preferred method of patterning the tri-layer mask and underlying tri-layer dielectric is shown. For purposes of this illustration, the tri-layer dielectric comprises organic trench and via level dielectric materials and an inorganic etch stop. The polish stop and top mask materials are inorganic while the etch buffer material is organic. The organic materials may be the same or different. The inorganic materials may be the same or different. In FIG. 3a, a photoresist, 180, is applied upon the tri-layer hardmask, and patterned with the trench pattern, 210, using standard lithographic exposure. In FIG. 3b, the trench pattern is transferred into the top mask 170 using a fluorine containing plasma. In FIG. 3c, the trench pattern is transferred into the etch buffer 160 using either a reducing or oxidizing plasma. This same etch chemistry also removes the photoresist. Following the trench definition in the uppermost two layers of the tri-layer hardmask, a second application of photoresist, 380, is patterned, 214, with the via design using standard lithographic practice, as shown in FIG. 3d. The via pattern is transferred into the polish stop 150 in the tri-layer hardmask using a fluorine containing plasma, as shown in FIG. 3E. This step completes the pattern definition in the tri-layer hardmask for both the trench and via patterns. The via pattern is transferred into the top dielectric 140 using an oxidizing or reducing plasma, as shown in FIG. 3f. This etch also removes the via photoresist layer 380. Exposure of the system to a fluorine plasma at this point transfers the via pattern into the etch stop 130, removes the top mask 170, and transfers the trench pattern into the polish stop 150, as shown in FIG. 3g. A final exposure of the system to either an oxidizing or reducing plasma transfers the trench pattern into the top dielectric 140 and the via pattern into the via 120, and removes the etch buffer 160, as shown in FIG. 3h. The final step is the removal of the thin barrier layer 110 with a modified fluorine plasma to reveal underlying circuit elements or interconnect structure. This method prepares the system for metal wiring definition using standard metal deposition and polishing techniques. After the metal pattern inlay, the semiconductor is ready for further interconnection with additional layers using the procedures described above.

If the system were inorganic dielectrics with an organic etch stop, the polish stop, etch buffer and top mask layers would be organic, inorganic and organic, respectively and the etch chemistries at each step would be reversed from the above accordingly.

Optionally, the top mask layer 170 may be photopatternable, preferably positive tone, in which case the initial photoresist layer 180 would not be needed. Similarly, the polish stop layer 150 may optionally be photopatternable, preferably negative tone, in which case the second photoresist 380 would not be needed.

Referring now to FIG. 4, one preferred method to pattern the tri-layer mask and underlying monolithic dielectric stack of FIG. 2 is shown. For purposes of this illustration the dielectric stack and the etch buffer layers are organic and the polish stop and top mask layers are inorganic. The opposite construction (i.e. inorganic dielectric and etch buffer with organic polish stop and top mask) could also be used with the opposite etch chemistry at each step from what is stated below. The organic materials may be the same or different. The inorganic materials may be the same or different. In FIG. 4a, a photoresist, 180, is applied upon the tri-layer hardmask, and patterned with the trench pattern, 210, using standard lithographic exposure. In FIG. 4b, the trench pattern is transferred into the top mask 170 using a fluorine containing plasma. In FIG. 4c, the trench pattern is transferred into the etch buffer 160 using either a reducing or oxidizing plasma. This same etch chemistry also removes the photoresist. Following the trench definition in the uppermost two layers of the tri-layer hardmask, a second application of photoresist, 380, is patterned, 214, with the via design using standard lithographic practice, as shown in FIG. 4d. With the contact pattern defined in the photoresist, the via pattern is transferred into the polish stop 150 in the tri-layer hardmask using a fluorine containing plasma, as shown in FIG. 4e. This step completes the pattern definition in the tri-layer hardmask for both the trench and via patterns. The contact pattern is at least partially transferred into the monolithic dielectric 125 using an oxidizing or reducing plasma, as shown in FIG. 4f. This etch also removes the contact photoresist layer 380. Exposure of the system to a fluorine plasma at this point removes the top mask 170, and transfers the trench pattern into the polish stop 150, as shown in FIG. 4g. A final exposure of the system to either an oxidizing or reducing plasma transfers the trench pattern and via pattern into the monolithic and removes the etch buffer 160, as shown in FIG. 4h. The final step is the removal of the thin barrier layer 110 with a modified fluorine plasma to reveal underlying circuit elements or interconnect structure. This method prepares the system for metal wiring definition using standard metal deposition and polishing techniques. After the metal pattern inlay, the semiconductor is ready for further interconnection with additional layers using the procedures described above.

Optionally, the top mask layer 170 may be photopatternable, preferably positive tone, in which case the initial photoresist layer 180 would not be needed. Similarly, the polish stop layer 150 may optionally be photopatternable, preferably negative tone, in which case the second photoresist 380 would not be needed.

Referring now to FIG. 5, there is shown a cross-sectional diagram illustrating an embodiment of the invention using a tri-layer dielectric and a tri-layer hardmask, wherein the polish stop and the top mask layers are patterned immediately after each deposition during the construction of the tri-layer hardmask. This approach may be convenient if photodefinable polish stop and top mask layers are used. For purposes of this illustration, the tri-layer dielectric comprises organic trench and via level dielectric materials and an inorganic etch stop and the polish stop and top mask materials are inorganic while the etch buffer material is organic. Referring now to FIG. 5, cross sectional schematics of the system, the method to construct and pattern the tri-layer mask and underlying tri-layer dielectric is shown. On a substrate comprising a first level device contact or interconnection pattern, a Cu diffusion barrier 110 is formed. This Cu diffusion barrier is preferably a CVD silicon nitride and most preferably a spin-on polymer. A tri-layer dielectric, consisting of the via dielectric 120, the etch stop 130, and the top dielectric 140, are applied by sequential deposition, preferably via spin coating, and cure. The patterned polish stop 750 is deposited and patterned with the trench pattern, 808. Preferably, this layer is solvent coated and patterned using standard lithographic and dry etching techniques and most preferably by direct irradiation of a photosensitive patterned polish stop 750 material, as shown in FIG. 5a. The etch buffer 160 is deposited, preferably by solvent coating, above the patterned polish stop 750, as shown in FIG. 5b. The patterned top mask 770 is subsequently applied and patterned with the via pattern, 812. Preferably this layer is solvent coated and patterned using standard lithographic and etch processes and most preferably by direct irradiation of a photosensitive top mask 770 material, as shown in FIG. 5c.

Figure 5A:
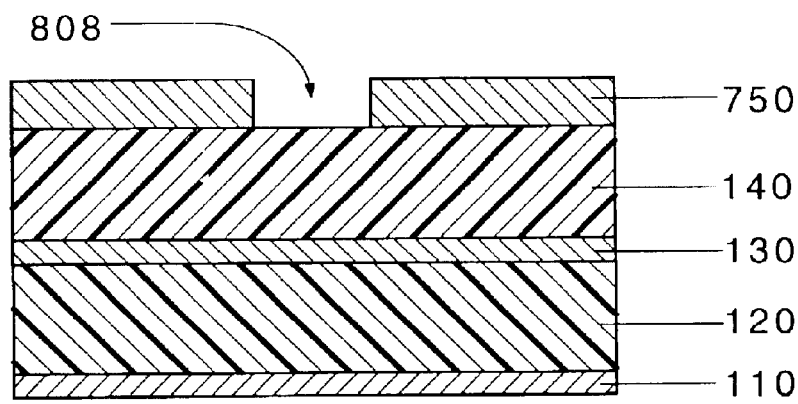
FIG. 5 is a schematic (not to scale) of an exemplary integration scheme using a photodefinable polish stop layer and a buried etch stop layer.
Figure 5B:
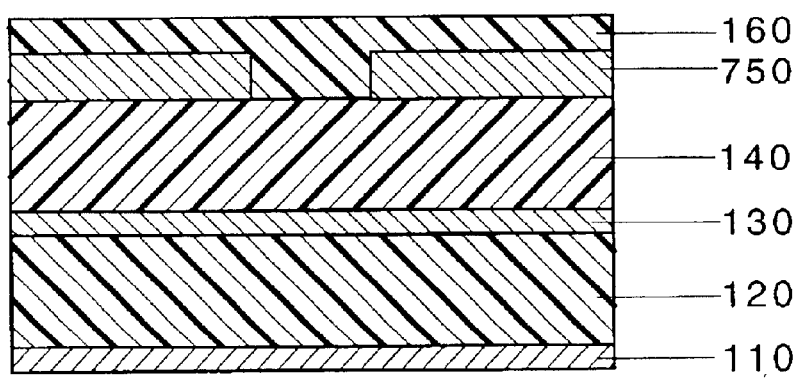
Figure 5C:
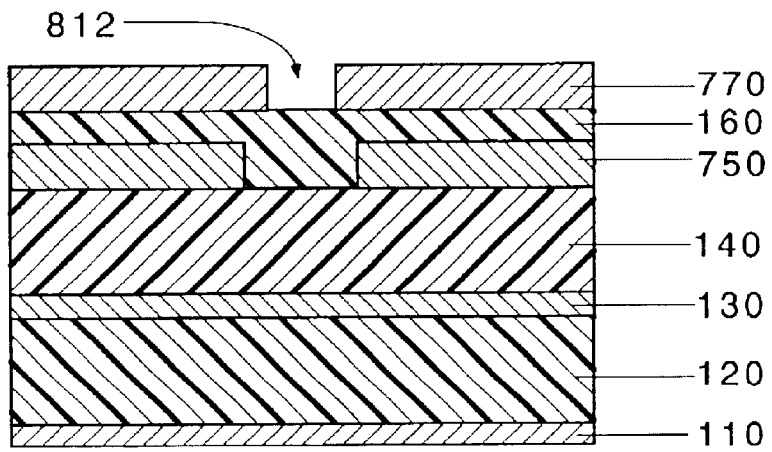
Figure 5D:
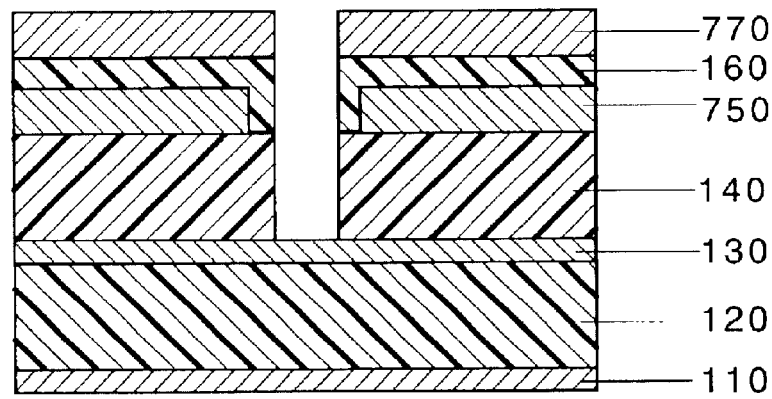
Figure 5E:
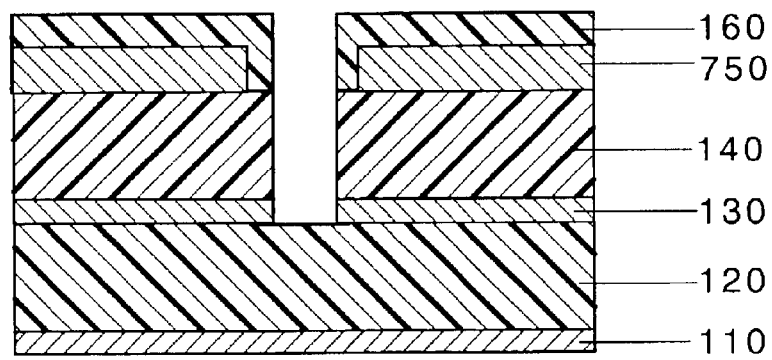
Figure 5F:
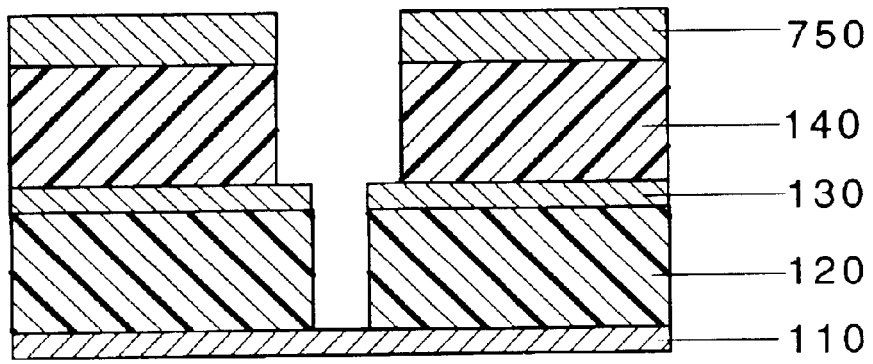
Figure 6A:
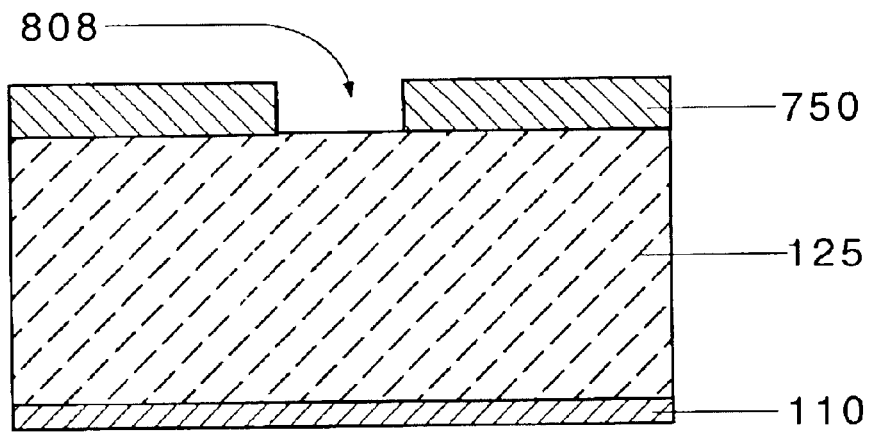
FIG. 6 is a schematic (not to scale) of an exemplary integration scheme using a photodefinable polish stop layer and a monolithic dielectric layer.
Figure 6B:
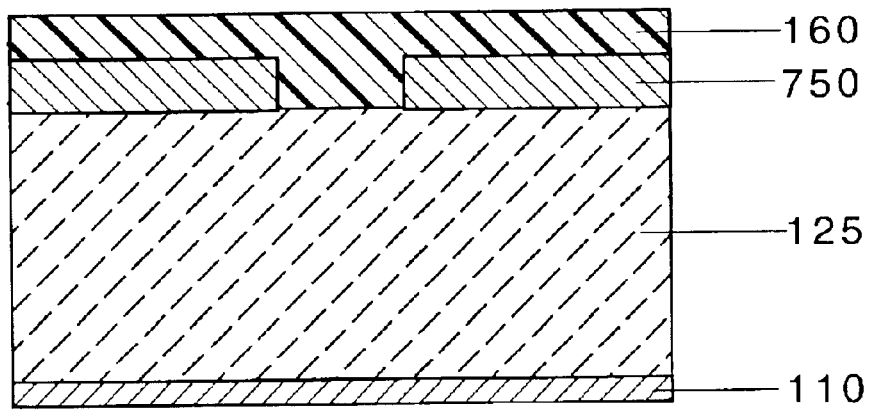
Figure 6C:
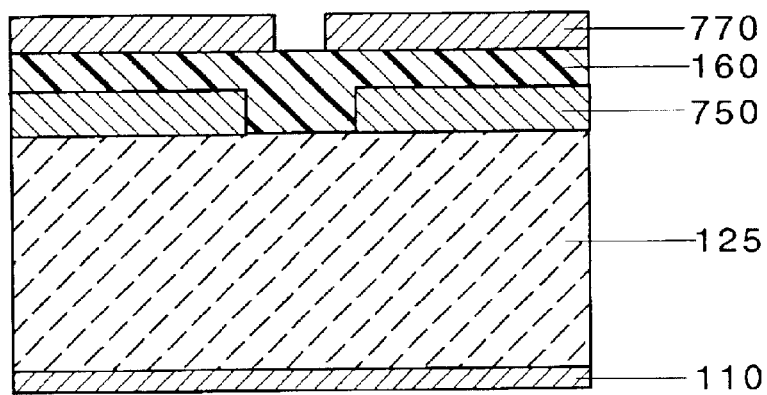
Figure 6D:
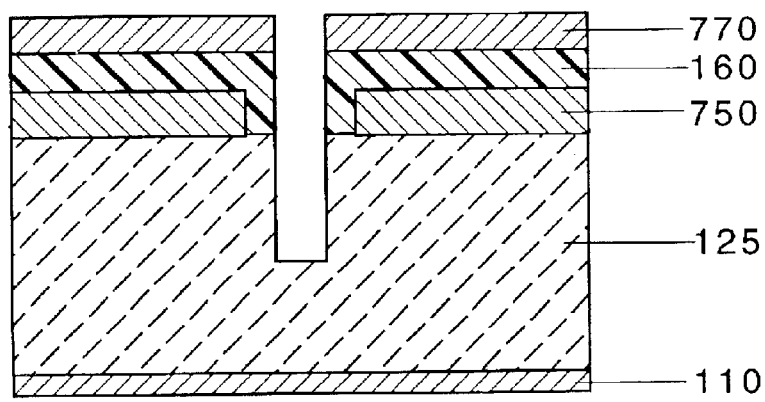
Figure 6E:
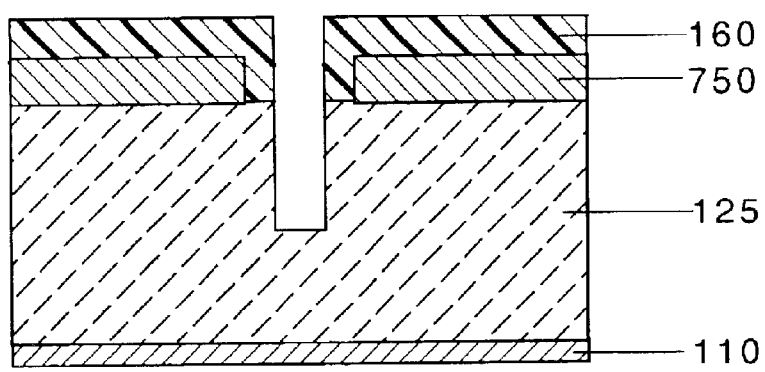
Figure 6F:
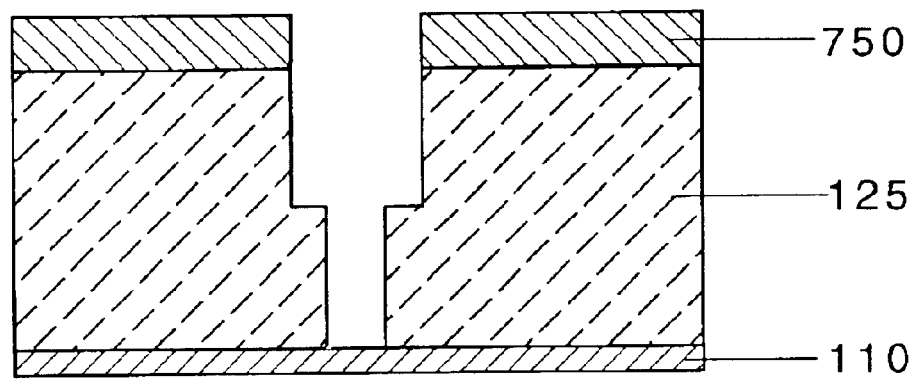

The wafer is placed into a reactive ion etching tool, and the via pattern is transferred first into the etch buffer 160 and top dielectric 140 layers by etching with an oxidizing or reducing plasma, as shown in FIG. 5*d*. In FIG. 5*e*, the via pattern is transferred into the etch stop 130 by etching with a fluorine containing plasma. This etch step also removes the patterned top mask 770. A final exposure of the system to either an oxidizing or reducing plasma transfers the trench pattern into the top dielectric 140 and the via pattern into the via dielectric 120, and removes the etch buffer 160, as shown in FIG. 5*f*. The final step is the removal of the thin barrier layer 110 with a modified fluorine plasma to reveal underlying circuit elements or interconnect structure. This method prepares the system for metal wiring definition using standard metal deposition and polishing techniques. After the metal pattern inlay, the semiconductor is ready for further interconnection with additional layers using the procedures described above.

If the system were inorganic dielectrics with an organic etch stop, the polish stop, etch buffer and top mask layers would be organic, inorganic and organic, respectively and the etch chemistries at each step would be reversed from the above accordingly.

Referring now to FIG. 6, there is shown a cross-sectional diagram illustrating an embodiment of the invention using a monolithic dielectric and a tri-layer hardmask, wherein the polish stop and the top mask layers are patterned immediately after each deposition during the construction of the tri-layer hardmask. This approach may be convenient if photodefinable polish stop and top mask layers are used. For purposes of this illustration, the monolithic dielectric comprises organic dielectric materials and the polish stop and top mask materials are inorganic while the etch buffer material is organic. On a substrate comprising a first level device contact or interconnection pattern, a Cu diffusion barrier 110 is formed. This Cu diffusion barrier is preferably a CVD silicon nitride and most preferably a spin-on polymer. A monolithic dielectric, (MD) 125, is applied, preferably by solvent coating with subsequent cure. As shown in FIG. 6*a*, the patterned polish stop 750 is deposited and patterned with the trench pattern, 808. Preferably, this layer is solvent coated and patterned using standard lithographic and dry etching techniques and most preferably by direct irradiation of a photosensitive patterned polish stop 750 material. The etch buffer 160 is deposited, preferably by solvent coating, above the patterned polish stop 750, as shown in FIG. 6*b*. The patterned top mask 770 is subsequently applied and patterned with the via pattern, 812. Preferably this layer is solvent coated and patterned using standard lithographic and etch processes and most preferably by direct irradiation of a photosensitive top mask 770 material, as shown in FIG. 6*c*. The wafer is placed into a RIE tool, and the via pattern is transferred first into the etch buffer 160 and then part way into the monolithic dielectric 125 by etching with an oxidizing or reducing plasma, as shown in FIG. 6*d*. In FIG. 6*e*, the patterned top mask 770 is removed with a fluorine containing plasma. A final exposure of the system to either an oxidizing or reducing plasma transfers the trench pattern and the contact pattern into the monolithic dielectric 125, and removes the etch buffer 125, as shown in FIG. 6*f*. The final step is the removal of the thin barrier layer 110 with a modified fluorine plasma to reveal underlying circuit elements or interconnect structure. This method prepares the system for metal wiring definition using standard metal deposition and polishing techniques. After the metal pattern inlay, the semiconductor is ready for further interconnection with additional layers using the procedures described above.

When porous dielectric layers are being used the pores may be formed either before or after etching and, if after etching, either before or after metallization. However, to ensure level surfaces for application of the mask systems it is preferable to form the pores after application of at least one of the top hardmask materials. Thus, for porous dielectric systems which are formed by removal of a thermally labile poragen material from a matrix dielectric material, it is preferred that the poragen and mask layers be selected such that the poragen or the thermally labile decomposition products of the poragen can diffuse through the hard mask(s). Preferably, in that instance the hardmaks layer(s) have a density of less than 1.5 grams/cm$^3$.

If the system were inorganic dielectrics with an organic etch stop, the polish stop, etch buffer and top mask layers would be organic, inorganic and organic, respectively and the etch chemistries at each step would be reversed from the above accordingly.

While any known dielectric material with the requisite dielectric constant may be used in this invention, organic dielectrics, particularly polyarylenes, are preferred. The most preferred dielectric materials comprise an organic polymer which is the reaction product of monomers having dienophile groups and diene groups that react by Diels Alder reaction. Particularly preferred organic polymers are those which are the reaction product of monomers comprising cyclopentadienone functional groups and acetylene (particularly phenyl acetylene) functional groups. At least some of the monomers necessarily have at least three functional groups in order to have the desired cross-linking property in the final film.

If a porous dielectric material is desired the matrix material or base dielectric material may be combined with a poragen, preferably a thermally labile poragen. Examples of these porogen materials include linear, branched, star, hyperbranched, dendritic, and cross-linked oligomers or polymers. One preferred porogen morphology is cross-linked polymeric nanoparticles. The porogen, optionally, is chemically bonded to the matrix material, e.g. by inclusion of a reactive functionality which will bond to the matrix. Suitable chemistries for the porogen depend in part upon the matrix material selected. Preferably, the porogens decompose at temperatures in the range of about 250° C. to about 400° C. Suitable chemistries include polystyrenes such as polystyrene and poly-α-methylstyrene; polyacrylonitriles, polyethylene oxides, polypropylene oxides, polyethylenes, polylactic acids, polysiloxanes, polycaprolactones, polyurethanes, polymethacrylates, polyacrylates, polybutadienes, polyisoprenes, polyamides, polytetrahydrofurans, polyvinyl chlorides, polyacetals, amine-capped alkylene oxides, poly lactides, polylactates, polypropyleneoxides, and ethylene glycol/poly (caprolactones).

Since the etch stop and, optionally, the polish stop layers may remain with the device, low dielectric constants are desired for these materials as well. Since the preferred dielectric materials are organic, the preferred etch stop and polish stop materials are inorganic. Preferred inorganic materials are cross-linked organosiloxanes. The organosiloxane preferably is formed from the hydrolyzed or partially hydrolyzed reaction products of substituted alkoxysilanes or substituted acyloxysilanes.

Hydrolysis of alkoxy or acyloxysilanes produces a mixture of nonhydrolyzed, partially hydrolyzed, fully hydrolyzed and oligomerized alkoxy silanes or acyloxysilanes. Oligomerization occurs when a hydrolyzed or partially hydrolyzed alkoxysilane or acyloxysilane reacts with another alkoxysilane or acyloxysilane to produce water, alcohol acid and a Si—O—Si bond. As used herein, the term "hydrolyzed alkoxysilane" or "hydrolyzed acyloxysilane" encompasses any level of hydrolysis, partial or full, as well as oligomerized. The substituted alkoxy or acyloxy silane prior to hydrolysis is preferably of the formula:

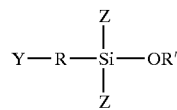

wherein R is $C_1$–$C_6$ alkylidene, $C_1$–$C_6$ alkylene, arylene, or a direct bond; Y is $C_1$–$C_6$ alkyl, $C_2$–$C_6$ alkenyl, a $C_{2-6}$ alkynyl, a $C_6$–$C_{20}$ aryl, 3-methacryloxy, 3-acryloxy, 3-aminoethyl-amino, 3-amino, —SiZ$_2$OR', or —OR'; R' is independently, in each occurrence, a $C_1$–$C_6$ alkyl or $C_2$–$C_6$ acyl; and Z is $C_1$–$C_6$ alkyl, $C_2$–$C_6$ alkenyl, $C_{2-6}$ alkynyl, $C_{6-20}$ aryl, or —OR'. The term "alkylidene" refers to aliphatic hydrocarbon radicals wherein attachment occurs on the same carbon. The term "alkylene" refers to radicals, which correspond to the formula —($C_nH_{2n}$)—. The term "aryl" refers to an aromatic radical, "aromatic" being defined as containing (4n+2) electrons, as described in Morrison and Boyd, *Organic Chemistry*, 3rd Ed., 1973. The term "arylene" refers to an aryl radical having two points of attachment. The term "alkyl" refers to saturated aliphatic groups, such as methyl, ethyl, etc. "Alkenyl" refers to alkyl groups containing at least one double bond, such as ethylene, butylene, etc. "Alkynyl" refers to alkyl groups containing at least one carbon to carbon triple bond. "Acyl" refers to a group having —C(O)R structure (e.g., a $C_2$ acyl would be —C(O)CH$_3$). "Acyloxy" refers to groups having —OC(O)R structure. The groups previously described may also contain other substituents, such as halogens, alkyl groups, aryl groups, and hetero groups, such as ethers, oximino, esters, amides; or acidic or basic moieties, i.e., carboxylic, epoxy, amino, sulfonic, or mercapto, provided the alkoxysilane remains compatible with the other components of the coating composition. Preferably, the silanes used are mixtures of silanes. The silanes may be alkoxy silane, acyloxy silane, trialkoxy-silanes, triacyloxysilanes, dialkoxysilanes, diacyloxysilanes, tetraalkyoxysilane or tetraacyloxysilanes. Examples of some of the organic groups directly attached to the silicon atom may be such things as phenyl, methyl, ethyl, ethacryloxypropyl, aminopropyl, 3-aminoethylaminopropyl, vinyl, benzyl, bicycloheptenyl, cyclohexenylethyl, cyclohexyl, cyclopentadienylpropyl, 7-octa-1-enyl, phenethyl, allyl or acetoxy. The silanes are preferably hydrolyzed or-partially hydrolyzed by a solventless process. The silanes will retain organic portions even after cure provided some organic groups are bonded directly to the silicon atom. In order to balance desired properties in the hardmask or etchstop layer, a mixture of silanes may be used. For example, applicants have found that use of an aryl alkoxy or aryl acyloxy silane (such as, phenyltrimethoxy silane) in combination with an alkyloxysilane or acyloxysilane having a group with unsaturated carbon-carbon bonds (e.g. alkenyl or alkyidenyl moieties such as vinyl or phenyethynyl) provides excellent wetting, coating and adhesion properties with the preferred organic polymeric dielectric materials, particularly those aromatic polymers which have additional carbon-carbon bond unsaturation. The presence of the aromatic substituted silane also improves moisture sensitivity and may improve dielectric constant over single silane systems. Furthermore, using alkylalkoxy silanes or alkyl acyloxy silanes (such as methyltrimethoxysilane or ethyltrimethoxysilane) in combination with the aryl and unsaturated substituted silanes has been found to further improve moisture retention/exclusion and reduce dielectric constant in the resulting film. Furthermore, a mixture of monoalkoxy, monoacyloxy, dialkoxy, diacyloxy, trialkoxy, triacyloxy, tetraalkoxy silanes or tetraacyloxy silanes may be used in the mixtures as well to enable enhancement of etch selectivity, adjustment of branching, etc.

Particularly, preferred is the following composition which is the hydrolzyed or partially hydrolyzed product of a mixture comprising (a) 50–95 mole % silanes of the formula

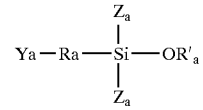

wherein Ra is $C_1$–$C_6$ alkylidene, $C_1$–$C_6$ alkylene, arylene, or a direct bond; Ya is $C_1$–$C_6$ alkyl, $C_2$–$C_6$ alkenyl, $C_{2-6}$ alkynyl, $C_6$–$C_{20}$ aryl, 3-methacryloxy, 3-acryloxy, 3-aminoethyl-amino, 3-amino, —SiZa$_2$ORa', or —ORa'; Ra' is independently, in each occurrence, a $C_1$–$C_6$ alkyl or $C_2$–$C_6$ acyl; and Za is $C_1$–$C_6$ alkyl, $C_2$–$C_6$ alkenyl, $C_{2-6}$ alkynyl, $C_{6-20}$ aryl, or —ORa', provided at least one of Za or the combination Ra-Ya comprises a non-aromatic carbon carbon bond unsaturation, (b) 5 to 40 mole percent

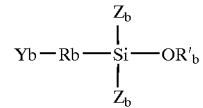

wherein Rb is $C_1$–$C_6$ alkylidene, $C_1$–$C_6$ alkylene, arylene, or a direct bond; Yb is $C_1$–$C_6$ alkyl, $C_2$–$C_6$ alkenyl, $C_{2-6}$ alkynyl, $C_6$–$C_{20}$ aryl, 3-methacryloxy, 3-acryloxy, 3-aminoethylamino 3-amino, —SiZb$_2$ORb', or —ORb'; Rb' is independently, in each occurrence, a $C_1$–$C_6$ alkyl or $C_2$–$C_6$ acyl; and Zb is $C_1$–$C_6$ alkyl, $C_2$–$C_6$ alkenyl, $C_{2-6}$ alkynyl, $C_{6-20}$ aryl, or —ORb', provided at least one of Zb or the combination of Rb-Yb comprises an aromatic ring, and (c) 0 to 45 mole percent

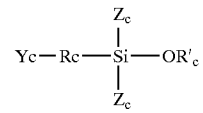

wherein Rc is $C_1$–$C_6$ alkylidene, $C_1$–$C_6$ alkylene, arylene, or a direct bond; Yc is $C_1$–$C_6$ alkyl, $C_2$–$C_6$ alkenyl, $C_2$–$C_6$ alkynyl, $C_6$–$C_{20}$ aryl, 3-methacryloxy, 3-acryloxy, 3-aminoethyl-amino, 3-amino, —SiZC$_2$ORc', or —ORc'; Rc' is independently, in each occurrence, a $C_1$–$C_6$ alkyl or $C_2$–$C_6$ acyl; and Zc is $C_1$–$C_6$ alkyl, $C_2$–$C_6$ alkenyl, $C_{2-6}$ alkynyl, $C_{6-20}$ aryl, or —ORc', provided at least one of Zc or the combination of Rc-Yc comprises an alkenyl. The mole percent is based on total moles of silanes (a), (b) and (c) present.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

EXAMPLE

A multilayer stack was prepared with the following sequence:
1) An adhesion promoter, Dow AP5000, was applied onto a bare silicon wafer at 600 rpm, spun at 3000 rpm for 30 seconds, and baked at 185° C. for 90 seconds.
2) A precursor solution to a porous dielectric was prepared by partially polymerizing a mixture of biscyclopentadienone functionalized monomers, tris-phenyl acetylene functionalized monomers, and polystyrene based cross-linked nanoparticles made by microemulsion polymerization as shown for example in U.S. application Ser. No. 10/077,646 (attorney docket no. 61568). The nanoparticles content was 20% by mass. The precursor solution was dispensed onto the adhesion promoter layer at 600 rpm, spun at 3000 rpm for 30 seconds, baked at 150° C. for 2 minutes under nitrogen, and finally baked at 400° C. for 3 minutes under nitrogen. This bake cross-linked the resin matrix, but did not remove the cross-linked nanoparticles, thus creating a contact dielectric layer at full density.
3) A cross-linkable organosiloxane compositionane oligomeric precursor was prepared by hydrolysis and subsequent copolymerization of vinyl triacetoxysilane and phenyl trimethoxysilane monomers as described in WO 02/16477. The cross-linkable organosiloxane solution was diluted to 8% solids in Dowanol PMA. This solution was applied at 60 rpm to the contact dielectric layer, spun at 3000 rpm for 30 seconds, and baked 265° C. for 60 seconds; thus creating an etch stop layer.
4) A second charge of the precursor solution described above was dispensed onto the etch stop layer at 600 rpm, spun at 3000 rpm for 30 seconds, baked at 150° C. for 2 minutes under nitrogen, and finally baked at 400° C. for 3 minutes under nitrogen, thus creating a trench dielectric layer at full density.
5) A second charge of the cross-linkable organosiloxane solution described above was diluted to 15% solids in Dowanol PMA. This solution was applied at 600 rpm to the trench dielectric layer, spun at 3000 rpm for 30 seconds, and baked 265° C. for 60 seconds; thus creating a polish stop layer.
2) SiLK-I™ dielectric resin (from The Dow Chemical Company) was dispensed onto the polish stop layer at 600 rpm, spun at 3000 rpm for 30 seconds, at 320° C. for 90 seconds under nitrogen, and finally baked at 400° C. for 3 minutes under nitrogen.
3) Finally, a third charge of the cross-linkable organosiloxane solution was applied at 600 rpm on the SiLK resin layer, spun at 3000 rpm for 30 seconds, and baked 265° C. for 60 seconds; thus creating a top hard mask layer.

Figure 7:
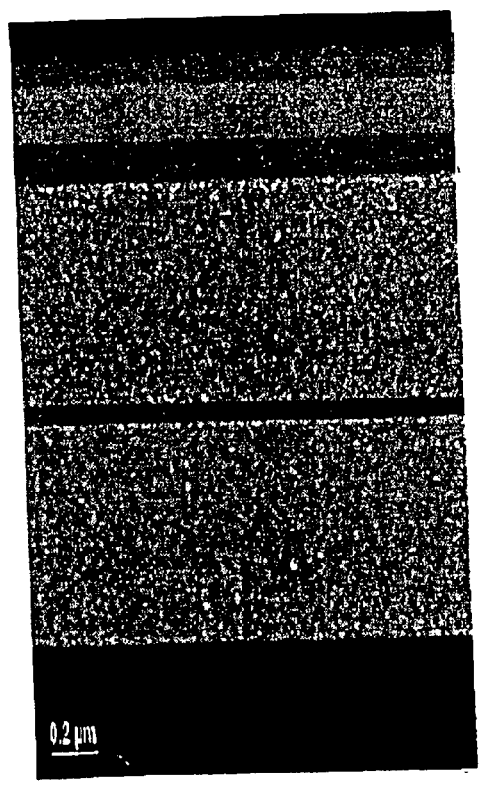
FIG. 7 is a photomicrograph of an exemplary multilayer structure of this invention having porous via and trench level dielectrics.

In all, seven layers were applied successively onto the silicon wafers with the composition alternating as noted, and intervening bakes to cross-link each film as noted. These bakes did not affect the density of the pre-cursor layers containing the cross-linked polystyrene based nanoparticle. After the spin coating, the sample wafer was placed in an oven under nitrogen at room temperature, ramped to 430° C. over one hour, and held at 430° C. for 40 minutes. After cooling to room temperature, the multilayers were found to be free of defects by optical inspection. Microscopic examination revealed that the cross-linked particles had been removed by degradation and subsequent evolution through the multiple masks contained in the construct, thus rendering the contact and trench dielectrics porous with reduced dielectric constant in a single thermal treatment as shown in FIG. 7.

What is claimed is:

1. A method of forming trenches and vias in a dielectric stack comprising the steps of:
   (a) providing a substrate;
   (b) applying the dielectric stack to the substrate wherein the dielectric stack comprises a top portion in which trenches will be formed and a bottom portion in which vias will be formed and an etch stop layer between the top and bottom portions wherein the dielectric constant of each of the top portion and the bottom portion is less than 3.0;
   (c) applying a first mask layer which acts as a stop during the polishing step and which has etch selectivity relative to the top portion of the dielectric stack and has etch characteristics similar those of the etch stop layer;
   (d) applying a second mask layer which has etch selectivity relative to the first mask layer and has etch characteristics similar to those of the top portion of the dielectric stack;
   (e) applying a third mask layer which has etch selectivity relative to the second mask layer and having etch characteristics similar to those for the first mask layer,
   (f) patterning the first mask layer in accordance with a trench pattern;
   (g) patterning the etch stop layer with via pattern;
   (h) etching the trench pattern into the top portion of the dielectric stack to form at least one trench and the via pattern into the bottom portion of the dielectric stack to form at least one via;
   (i) depositing a metal in the vias and trenches;
   (j) polishing away excess metal wherein the first mask layer serves as a polishing stop;
   wherein only three mask layers are used and at least a substantial portion of the third mask layer is removed during patterning of either the first mask layer or the etch stop layer and wherein at least a substantial portion of the second mask layer is removed during etching of the dielectric stack and wherein all the layers are applied via solvent coating.

2. The method of claim 1 wherein all the layers are applied via spin coating.

3. The method of claim 1 wherein the top portion and the bottom portion of the dielectric stack and second mask layer are organic and the etch stop, the first mask layer and the third mask layer are inorganic.

4. The method of claim 1 wherein the top portion and the bottom portion of the dielectric stack comprise a thermally labile poragen in discrete domains within a dielectric matrix material and the poragen is removed by heating after application of at least one of the mask layers.

5. The method of claim 4 wherein the poragen or thermal decomposition products of the poragen diffuse through the at least one of the mask layers.

6. The method of claim 1 wherein the first mask layer is photodefinable and is patterned by imagewise exposure to radiation and development.

7. The method of claim 1 wherein the step of forming a trench pattern in the first mask layer comprises applying a photoresist over the third mask layer, imaging and developing the photoresist with the trench pattern, etching the trench pattern into the third mask layer, etching the trench pattern into the second mask layer and etching the trench pattern into the first mask layer.

8. The method of claim 7 wherein prior to etching the trench pattern into the first mask layer a second photoresist material is applied, the second photoresist is imaged and developed with the via pattern, the via pattern is etched into the first mask layer, and the etched into the top portion of the dielectric stack, and then the etch stop and the first mask layer are simultaneously etched forming the trench pattern in the first mask layer and the via pattern in the etch stop layer.

9. This second claim 8 which was misnumbered has been cancelled.

10. The method of the claim 1 wherein the first and the third mask layers have etch selectivity relative to one another of less than 5:1.

11. The method of claim 1 wherein the etch selectivity ratio of the first hard mask layer to the top portion of the dielectric stack is greater than about 7:1.

12. The method of claim 1 wherein the etch selectivity ratio of the first mask layer to the etch stop is less than about 3:1.

13. The method of claim 1 wherein the third mask layer is not photodefinable.

14. The method of claim 1 wherein the third mask layer is photodefinable.

15. The method of claim 1 wherein the second mask layer and the top portion of the dielectric stack both comprise polyarylene materials.

16. The method of claim 1 wherein the first and third mask layers are the same material as the etch stop layer.

17. A method of forming trenches and vias in a dielectric comprising the steps of:
   (a) providing a substrate;
   (b) applying the dielectric layer to the substrate wherein the dielectric layer comprises a top portion in which trenches will be formed and a bottom portion in which vias will be formed and wherein the dielectric constant of the dielectric layer is less than 3.0;
   (c) applying a first mask layer which acts as a stop during the polishing step and which has etch selectivity relative to the dielectric layer;
   (d) applying a second mask layer which has etch selectivity relative to the first mask layer and has which characteristics similar to etch characteristics of the dielectric layer;
   (e) applying a third mask layer which has etch selectivity relative to the second mask layer and which etch characteristics similar to those for the first mask layer;
   (f) pattering the second and third mask layers in accordance with a trench pattern;
   (g) patterning the first mask layer in accordance with a via pattern;
   (h) etching the via pattern a portion of the way into the dielectric layer;
   patterning the first mask layer in accordance with the trench pattern made in the second and third mask layers and simultaneously removing a substantial portion of the third mask layers;
   (j) continue the etch of the dielectric layer thereby forming at least one via in the bottom portion of the dielectric layer and forming at least one trench in the top portion of the dielectric layer;
   (k) wherein the third mask layer is substantially removed during patterning of either the first mask layer or the etch stop layer and wherein the second mask layer is substantially removed during etching of the dielectric stack;
   (l) deposing a metal in the vias and trenches;
   (m) polishing away excess metal wherein the first mask layer serves as a polishing stop, wherein only three mask layers are used and all the layers are applied by solvent coating.

18. The method of claim 17 wherein the dielectric layer and the second mask layer are organic and the first and third mask layers are inorganic.

19. The method of claim 17 wherein at least one of the first and third mask layers is photodefinable.

20. The method of claim 19 wherein the first mask layer is photodefinable.

21. The method of claim 19 wherein in third mask layer is photodefinable.

22. The method of claim 17 wherein the dielectric layer comprises a thermally labile poragen in discrete domains within a dielectric matrix material and the poragen is removed by heating after application of at least one of the hard mask layers.

23. The method of claim 22 wherein the poragen or thermal decomposition products of the poragen diffuse through the at least one of the hard mask layers.

24. The method of claim 17 wherein all the layers are applied via spin coating.

25. The method of claim 17 wherein the first and the third mask layers have etch selectivity relative one another of less than 5:1.

26. The method of claim 17 wherein the etch selectivity ratio of the first mask layer to the top portion of the dielectric stack is greater than about 7:1.

27. The method of claim 17 wherein the third mask layer is not photodefinable.

28. The method of claim 17 wherein the second mask layer and the top portion of the dielectric stack both comprise polyarylene materials.

29. The method of claim 17 wherein the first and third mask layers are the same material.

30. A method of forming trenches and vias in a dielectric comprising the steps of:
   (a) providing a substrate;
   (b) applying the dielectric layer to the substrate wherein the dielectric layer comprise, a top portion in which trenches will be formed and a bottom portion in which vias will be formed and wherein die dielectric constant of the layer is less than 3:0;
   (c) applying a first mask layer which acts as a stop during the polishing step and which has etch selectivity relative to the dielectric layer and forming a trench pattern in this first mask layer;
   (d) applying a second mask layer which has etch selectivity relative to the first mask layer and has etch characteristics similar to etch characteristics of the dielectric layer;
   (e) applying a third mask layer which has etch selectivity relative to the second mask layer and which has etch characteristics similar to those of the first mask layer;
   (f) patterning the second and third mask layers is accordance with a via pattern;
   (g) etching the via pattern a portion of the way into the dielectric layer;
   (h) removing the third mask layer;

(i) continue the etch of the dielectric layer thereby fanning at least one via in the bottom portion of she dielectric layer and forming at least one trench in the top portion of the dielectric layer, wherein the second mask layer is substantially removed during etching of the dielectric stack;

(j) depositing a metal in the vias and trenches;

(k) polishing away excess metal wherein the first mask layer serves as a polishing stop;

wherein only three mask layers are used and all the layers are applied by solvent coating.

31. The method of claim 30 wherein the first mask layer is photodefinable and the trench pattern is formed by exposing that layer to activating wavelengths of radiation and developing the layer.

32. The method of claim 30 wherein the dielectric layer comprises a thermally labile poragen in discrete domains within a dielectric matrix material and the poragen is removed by heating after application of at least one of the mask layer.

33. The method of claim 30 wherein the poragen or thermal decomposition products of the poragen diffuse through the at least one of the mask layers.

34. The method of claim 30 wherein the third mask layer is not photodefinable.

35. The method of claim 30 wherein the layers are applied by spin coating.

36. The method of claim 30 wherein the second mask layer and the top portion of the dielectric stack both comprise polyarylene materials.

37. The method of claim 30 wherein the first and third mask layers are the same material.

* * * * *